United States Patent [19]

Boudault

[11] Patent Number: 4,516,086

[45] Date of Patent: May 7, 1985

[54] FREQUENCY MODULATOR FOR THE TRANSMISSION OF ANALOG DATA

[75] Inventor: Robert Boudault, Limours, France

[73] Assignee: 501 Telecommunications Radioelectriques et Telephoniques, Paris, France

[21] Appl. No.: 511,379

[22] Filed: Jul. 6, 1983

[30] Foreign Application Priority Data

Jul. 7, 1982 [FR] France ................. 82 11925

[51] Int. Cl.³ .................. H03B 5/20; H03C 3/02; H04L 27/12
[52] U.S. Cl. .................... 332/16 R; 331/143; 331/177 R; 375/65
[58] Field of Search ............ 332/16 R, 16 T; 455/42, 455/110; 331/143, 177 R, 179; 375/65

[56] References Cited

U.S. PATENT DOCUMENTS 3,835,419 9/1974 Milne et al. ................. 332/16 R
4,323,862 4/1982 Boudault et al. ............ 332/16 R X Primary Examiner—Siegfried H. Grimm
Attorney, Agent, or Firm—Thomas A. Briody; William J. Streeter

[57] ABSTRACT

A modulator transmitting an analog data signal by variation of the frequency of an oscillator comprising an integrator (1, 2) and a bistable circuit with trigger hysteresis (8 to 13). The two-level voltage from the bistable circuit, taken to a terminal of a resistor network (6, 7, 30) connected to the input of the integrator, is formed from the potential O and the potential kU, which is lower than the supply voltage U, applied respectively to the inputs of two analog switches (12, 13) whose outputs are connected to the output of the bistable circuit. The data signal $v_e$ is applied to the input of a conversion circuit (17) arranged to supply voltages $v_{e1}$ and $v_{e2}$ varying linearly as a function of $v_e$ and symmetrically with respect to $kU/2$ and applied respectively to the inputs of two further analog switches (26, 27) whose outputs are connected to another terminal in the resistor network. The input and output signals of the inverter (9) of the bistable circuit are used to control the switches.

4 Claims, 6 Drawing Figures

FREQUENCY MODULATOR FOR THE TRANSMISSION OF ANALOG DATA

The invention relates to a modulator for transmitting an analog data signal by variation of the frequency of an oscillator comprising a first operational amplifier combined with a capacitor to form an integrator whose output is connected to the input of a bistable circuit with trigger hysteresis, the output of the bistable circuit supplying a two-level voltage which is applied to one terminal of a first resistor whose other terminal is connected to the input of said integrator so as to produce at the output a triangular wave voltage whose frequency depends on the current flowing through said first resistor, said bistable circuit being formed by a second operational amplifier followed by an inverter, one input of this operational amplifier being connected to the intermediate terminal of a resistor bridge connected between the outputs of said integrator and said bistable circuit.

A modulator of this kind may be used in cases where it is desired to transmit in analog form, because this is more convenient and more economical, information originating from various transducers such as, for example, recorders, thermometer probes, etc.

Another interesting use of such a modulator is for the transmission of analog medical data (e.g. recordings of electrocardiograms) over a telephone line, from a subscriber's set to a central station. In this case transmission must be in accordance with Recommendation V.16 of the CCITT.

French Patent Specification No. 2,453,536 describes a modulator incorporating an oscillator with a triangular wave voltage output of the kind described in the preamble and transmitting digital data by an identical frequency shift around two distinct central frequencies.

The present invention has for its object to provide a modulator for the transmission of analog data by the linear variation of the oscillator frequency, obtained by the continuous variation of the charging or discharging current of the capacitor of the integrator as a function of the data signal. A further object of the invention is to provide means for obtaining a very great frequency stability with respect to the supply voltage and the temperature, as well as increased reliability.

According to the invention, said two-level voltage at the output of said bistable circuit with trigger hysteresis is formed from zero ground potential and a fixed positive potential lower than the supply voltage U, applied respectively to the inputs of a first and a second analog switch whose common outputs are connected to the output of said bistable circuit, the input and output signals of said inverter being used respectively to control said first and second switches, said data signal being applied to the input of an analog data conversion circuit arranged so as to supply at its outputs a first and a second voltage which are variable as a function of the data signal and symmetrical with respect to the mean value of the fixed potentials at the inputs of said first and second switches, said first and second variable voltages being respectively applied to the inputs of a third and a fourth analog switch having their common outputs connected to one terminal of a second resistor whose other terminal is common with that of said first resistor, the input and output signals of the inverter being used respectively to control said third and fourth switches.

The modulator according to the invention can also transmit a digital data signal with the aid of a frequency shift by connecting to the input of said analog data conversion circuit the output of a digital data conversion circuit converting a control signal applied to its output and whose potential values are $+U$ and $-U$ into another control signal whose potential values are chosen such as to produce said frequency shift.

The invention will now be further described, by way of example, with reference to the accompanying drawings, in which:

FIG. 1 shows a diagram of the modulator according to the invention;

FIG. 2, diagram 2a shows the voltage at the input of the bistable circuit, diagram 2b shows the voltage at the inverter of the bistable circuit, diagram 2c shows the voltage at the output of this bistable circuit, diagram 2d shows the triangular wave voltage at the output of the integrator and diagram 2e shows the voltage at the common output of the third and fourth switches;

Figure 1:
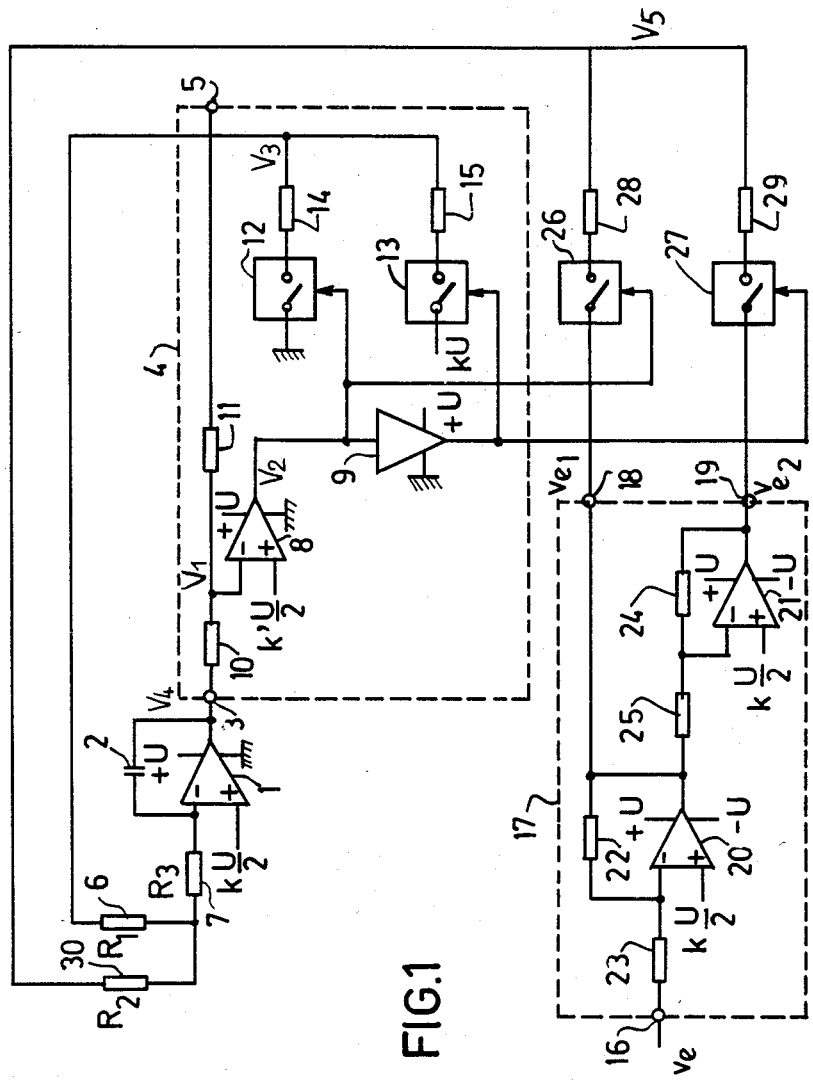

The modulator according to the invention as shown in FIG. 1 comprises an integrator circuit formed by an operational amplifier 1, by a capacitor 2 of capacitance C connected between the inverting input and the output of amplifier 1 and finally by a resistor network connected to the inverting input which will be described below. The operational amplifier 1 is fed from a source of voltage U and its non-inverting input is given a potential $kU/2$, where k is a number less than 1. The output of operational amplifier 1 is connected to an input terminal 3 of a bistable circuit with trigger hysteresis 4. An output terminal 5 of this bistable circuit is connected to one terminal of a resistor 6 of value $R_1$ whose other terminal is connected to the inverting input of amplifier 1 through a resistor 7 of value $R_3$. A part of the bistable circuit is constituted by an operational amplifier 8 forming a comparator and followed by an inverter 9, the inverting input of amplifier 8 being connected to the intermediate terminal of a resistor bridge 10, 11 connected between input 3 and output 5 of the bistable circuit and the non-inverting input of amplifier 8 being given a potential $k'U/2$, with $k<k'<1$. Amplifier 8 and inverter 9 are also fed from the source of voltage U.

The circuit described above forms an oscillator of a kind found in the prior art and it provides a triangular wave voltage at the output of amplifier 1 when a two-level voltage from bistable circuit 4 is applied to the input of the integrator.

In the modulator according to the present invention intended to transmit an analog data signal, the two-level voltage is formed from the zero potential of the ground and the potential kU, applied respectively to the inputs of analog switches 12 and 13 whose outputs are connected through resistors 14 and 15 to output terminal 5 of the bistable circuit. The input and output signals of inverter 9 are used to control switches 12 and 13, respectively. There is thus obtained at output terminal 5 a two-level voltage which changes from the value 0 to the value kU when the voltage at the inverting input of comparator 8 only just exceeds the voltage threshold k'U/2 and which changes from the value kU to the value 0 when this voltage becomes only just lower than the voltage threshold k'U/2. This functioning as a bistable circuit with a certain trigger hysteresis is due to the fact that when the output voltage of inverter 9 changes from 0 to U, the voltage at the inverting input of comparator 8 suddenly rises to a value greater than k'U/2 and when the output voltage of inverter 9 changes from U to 0, this voltage suddenly drops to a value lower the k'U/2.

The analog data signal $v_e$ to be transmitted is applied to an input terminal 16 of an analog data conversion circuit 17. This circuit, which applies a voltage $v_{e1}$ to an output terminal 18 and a voltage $v_{e2}$ to another output terminal 19, is designed so that voltage $v_{e1}$ and $v_{e2}$ are linearly variable as a function of $v_e$ and symmetrical with respect to the potential kU/2. It is formed by operational amplifiers 20 and 21 which are fed by sources of voltages $+U$ and $-U$ and each receive a potential kU/2 at its noninverting input. The inverting input of amplifier 20 is connected to its output through a resistor 22 and to input 16 of the conversion circuit through a resistor 23. The inverting input of amplifier 21 is connected to its output through a resistor 24 and to the output of amplifier 20 through a resistor 25 with the same value as resistor 24. The outputs of operational amplifiers 20 and 21 are respectively connected to outputs 18 and 19 of circuit 17 and to the inputs of two analog switches 26 and 27 whose outputs are connected through resistors 28 and 29 to a terminal of a resistor 30 with a value $R_2$, the other terminal of this resistor being common with that of resistor 6. Resistors 6, 7 and 30 form the said resistor network at the input of the integrator circuit. Resistors 14, 15, 28 and 29 are for protection against the simultaneous conduction of the analog switches. The input and output signals of inverter 9 are used to control switches 26 and 27, respectively. There is thus obtained at the said terminal of resistor 30 a voltage which changes from the value $v_{e1}$ to the value $v_{e2}$ when the voltage at the inverting input of comparator 8 only just exceeds the threshold voltage k'U/2 and which changes from the value $v_{e2}$ to the value $v_{e1}$ when that voltage becomes only just lower than the threshold voltage k'U/2.

The circuits used (operational amplifiers, analog switches) operate from the same single power-supply voltage; the output voltage kU from the bistable circuit and the reference voltages kU/2 and k'U/2 applied to the noninverting inputs of the operational amplifiers can be obtained by means of a divider bridge, so that in fact the modulator according to the invention needs only a single power-supply source, which, in addition to the advantage of simplicity, contributes to the stability of the frequencies with respect to the power-supply voltage.

The reliability of the circuits is increased by the fact that they are realized as hybrid circuits. Furthermore, the prior art as referred to above has demonstrated the high stability of the frequencies with respect to temperature fluctuations, thanks mainly to the arrangement of resistor 7 between the inverting input of operational amplifier 1 and the terminal common to resistors 6 and 30.

Figure 2:
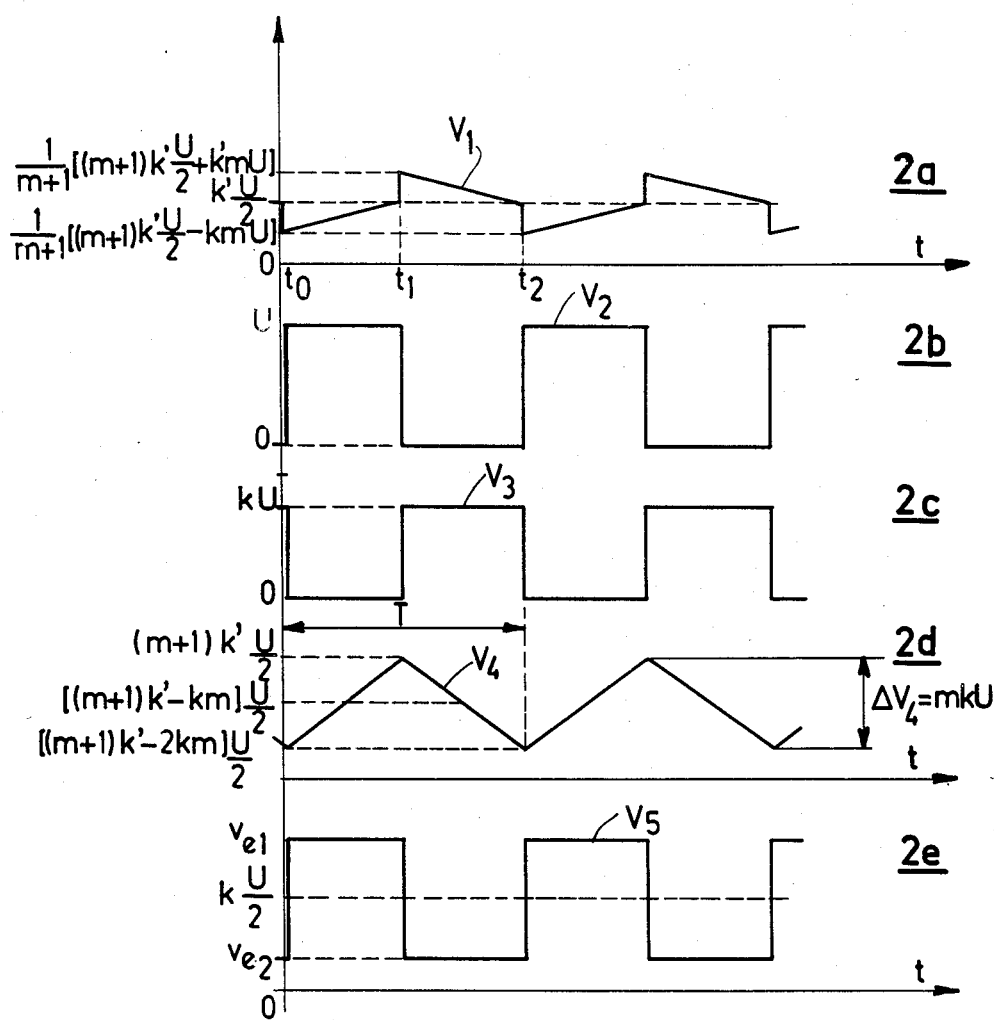

The operation of the modulator according to the invention is illustrated by the diagrams in FIG. 2. Diagram 2a shows the voltage $V_1$ at the inverting input of comparator 8. Diagram 2b shows the voltage $V_2$ at the output of that comparator. Diagram 2c shows the two-level voltage $V_3$ at the output of bistable circuit 4. Diagram 2d shows the output voltage $V_4$ from the oscillator, measured at the output of operational amplifier 1. Diagram 2e shows the voltage $V_5$ formed at the output of switches 26 and 27 and whose amplitude is a function of the analog data signal $v_e$ (it should be noted that, the frequency of the oscillator being high in relation to the frequencies of the baseband data signal, the variations of the latter have only a slight influence on the amplitude of voltage $V_5$ during several cycles of this voltage).

Figure 3:
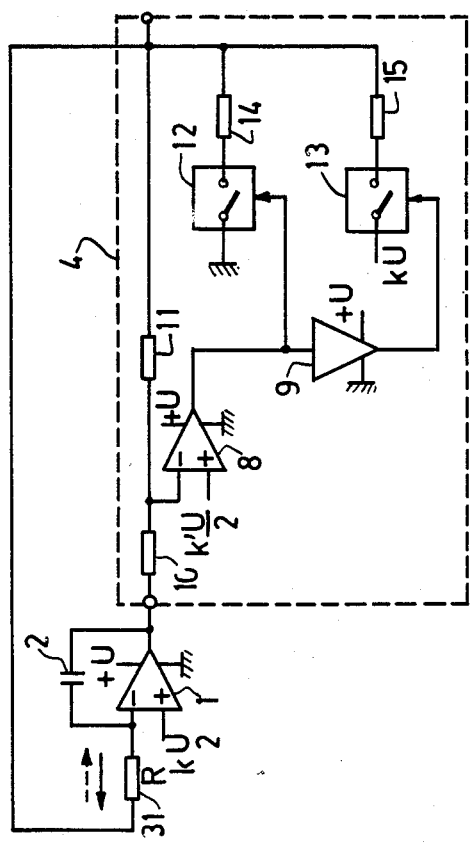
FIG. 3 shows a diagram of the oscillator used in the modulator according to the invention.

In order to describe the operation of the modulator according to the invention, it will be useful first to explain the operation of the basic oscillator used in that modulator. This basic oscillator, shown in FIG. 3, includes certain elements shown in FIG. 1 and bearing the same references, namely operational amplifier 1, capacitor 2 and bistable circuit 4, the latter comprising comparator 8, inverter 9, resistor bridge 10, 11 and switches 12 and 13. In this basic oscillator the two-level voltage $V_3$ at the output of the bistable circuit is applied to a terminal of a single resistor 31 with a value R, whose other terminal is connected to the inverting output of operational amplifier 1.

Examination of the diagrams of FIG. 2 shows that in the situation immediately before instant $t_o$ at which the decreasing voltage $V_1$ reaches the value k'U/2 applied to the inverting input of comparator 8, the voltage $V_3$ is then kU. The same current passing through resistors 10 and 11, the ratio of whose values is m:1, it can be readily deduced that voltage $V_4$ at the output of amplifier 1 has a minimum value $V_{4m}$ such that:

$$V_{4m}=[(m+1)k'-2km]U/2$$

At instant $t_o$, comparator 8 trips, voltage $V_3$ at the output of the bistable circuit assumes a value of 0 and voltage $V_1$ suddenly drops to a value lower than k'U/2. Since the voltage at the non-inverting input of operational amplifier 1, whose gain is assumed infinite, is equal to kU/2, the current in resistor 31 is kU/2R and flows in the direction indicated by the continuous arrow. The output voltage $V_4$ then increases linearly with a slope kU/(2RC).

Voltage $V_1$ also increases linearly and it can be easily shown that immediately before the instant $t_1$ at which it reaches the reference value k'U/2 applied to the noninverting input of comparator 8, the output voltage $V_4$ reaches the maximum value $V_{4M}$ such that:

$$V_{4M}=(m+1)k'U/2.$$

At instant $t_1$, comparator 8 trips, the output from bistable circuit 4 delivers a voltage $V_3=kU$ and voltage $V_1$ suddenly rises to a value exceeding k'U/2. The current through resistor 31 is then reversed and flows in the direction of the broken arrow while retaining its amplitude kU/2R. Output voltage $V_4$ decreases linearly with a slope $-kU/(2RC)$.

At instant $t_2$ operation is identical to that explained for instant $t_o$.

From the above results it is possible to calculate the frequency F of triangular wave output voltage $V_4$ of the oscillator. For a variation $\Delta V_4$ of this voltage during the time interval $\Delta t$, the general expression for the charging or discharging current of capacitor 2 is $I=\Delta V_4/\Delta t$. This current flowing in resistor 31 has the value $I=\pm kU/2$ as has been shown above. If the variation $\Delta V_4$ is taken as the difference between the maximum and minimum values of voltage $V_4$, the $\Delta V_4 = kmU$. It will be seen in diagram 2d that the corresponding time interval $\Delta t$ is equal to the half-cycle $T/2$ of the oscillator. From this, therefore, is deduced the value of the frequency:

$$F = 1/T = 1/(4mRC).$$

This value of F is independent of the power-supply voltage U.

The mean value of the triangular wave voltage $V_4$ can be written as follows:

$$V_{4moy} = \tfrac{1}{2}(V_{4m} + V_{4M})/2 = [(m+1)k' - km]U/2.$$

For this mean value to be equal to U/2 it is necessary to have the following relation between the coefficients k and k':

$$\frac{km + 1}{m + 1} = k'.$$

This relation can be used to centre on U/2 the input signal to a filter connected to the output of amplifier 1. If, for example, $m = \tfrac{1}{2}$ and $k = \tfrac{3}{4}$ (U = 12 V and kU = 9 V), the value of k' is 11/12.

In the case of the modulator according to the invention as shown in FIG. 1, the charging or discharging current of capacitor 2 is equal to the current flowing through common resistor 7 of the resistor network connected to the inverting input of amplifier 1. The value of this current can be determined from the positions of switches 26 and 27 which define the variation of voltage $V_5$ between the values $v_{e1}$ and $v_{e2}$ which are proportional to the data signal.

Figure 4:
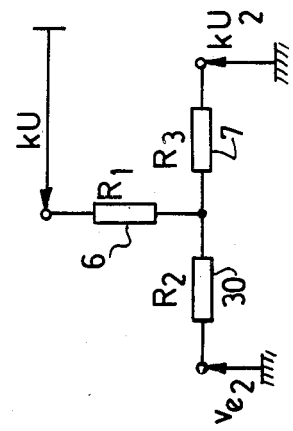
FIG. 4 shows the resistor network connected to the input of the integrator and the voltages which are applied to this network.

Suppose, for example, that switch 26 is set to its open position. Switch 27 is then set to its closed position so that voltage $V_5$ has the value $v_{e2}$. Current I is easily obtained by examining the diagram in FIG. 4, which shows the network of resistors 6, 7 and 30 interconnected as in FIG. 1. One terminal of resistor 7 which is traversed by current I is always at a voltage which is practically equal to kU/2 if it is assumed that the gain of operational amplifier 1 is infinite. When voltage $V_5$ has the value $v_{e2}$, the terminals of resistors 6 and 30 which are not connected to resistor 7 acquire voltage values of respectively kU and $v_{e2}$ shown in FIG. 4. A straight-forward calculation shows that current I through resistor 7 has the following value if we assume $1/R_1 = Y_1$ and $1/R_2 = Y_2$:

$$I = \frac{-Y_2(kU/2 - v_{e2}) + Y_1 kU/2}{1 + R_3(Y_1 + Y_2)}$$

If this value is substituted in the equation $I = C\Delta V_4/\Delta t$ and the values of $\Delta V_4$ and $\Delta t$ defined above are also substituted, the frequency delivered by the modulator according to the invention is obtained as a function of the voltage $v_2$:

$$F = \frac{-Y_2(kU/2 - V_{e2}) + Y_1 kU/2}{1 + R_3(Y_1 + Y_2)} \cdot \frac{1}{2 C km U}$$

Voltages $v_{e1}$ and $v_{e2}$ are delivered by the analog data conversion circuit 17.

To determine the equations for variation of the voltages $v_{e1}$ and $v_{e2}$ as a function of $v_e$, Kirchoff's law is applied to the common point of resistors 22 and 23 on the one hand and of 24 and 25 on the other hand. This yields the following equations:

$$v_{e1} = kU/2 - A(v_e - kU/2)$$

$$v_{e2} = kU/2 + A(v_e - kU/2)$$

in which A is the ratio between the values of resistors 22 and 23.

The voltages $v_{e1}$ and $v_{e2}$ delivered by circuit 17 thus show a linear variation as a function of the data signal $v_e$ while remaining symmetrical in relation to the voltage kU/2, the mean value of the potentials applied to the inputs of switches 12 and 13.

Substituting the above expression for $v_{e2}$ in the formula giving the frequency delivered by the modulator as a function of $v_{e2}$, the following general expression of that frequency as a function of the analog data signal $v_e$ is obtained:

$$F = \frac{Y_1 - AY_2}{1 + R_3(Y_1 + Y_2)} \cdot \frac{1}{4Cm} + \frac{AY_2}{1 + R_3(Y_1 + Y_2)} \cdot \frac{1}{2C km U} v_e$$

This expression can be broken down into two parts: the fixed part $F_o$ which is independent of the power-supply voltage U and a variable part F which is a function of the data signal:

$$\left. \begin{array}{l} F_o = \dfrac{Y_1 - AY_2}{1 + R_3(Y_1 + Y_2)} \cdot \dfrac{1}{4Cm} \\[2mm] \Delta F = \dfrac{AY_2}{1 + R_3(Y_1 + Y_2)} \cdot \dfrac{1}{2C km U} v_e \end{array} \right\} \quad (1)$$

It is thus seen that $F < F_o$ if $v_e < 0$ and $F > F_o$ if $v_e > 0$.

The next step is to compose formulae making it possible to determine the values of resistors $R_1$ and $R_2$ for a centre frequency $F_o$ and a frequency deviation $\Delta F$ resulting from a data signal $v_e$.

The following is derived from (1):

$$\frac{\Delta F}{F_o} = \frac{2A Y_2 v_e}{kU(Y_1 - AY_2)}$$

The transformation of this expression yields a first relation between $Y_1$ and $Y_2$:

$$Y_1 = Y_2\left(A + \frac{2A F_o}{\Delta F} \cdot \frac{v_e}{kU}\right) \quad (2)$$

If the relation $\Delta F/F_o$ is introduced into the expression for $F_o$, the latter may be written:

$$F_o = \frac{2A v_e Y_2 F_o}{\Delta F kU[1 + R_3(Y_1 + Y_2)]} \cdot \frac{1}{4Cm}$$

The transformation of this expression brings out a second relation between $Y_1$ and $Y_2$:

$$Y_1 = Y_2\left(\frac{1}{R_3} \frac{2A v_e}{\Delta F kU} \cdot \frac{1}{4Cm} - 1\right) - \frac{1}{R_3} \quad (3)$$

The elimination of $Y_1$ from equations (2) and (3) yields:

$$R_2 = R_3 \left[ \frac{2A\,v_e}{\Delta F\,kU} \left( \frac{1}{4R_3 Cm} - F_o \right) - 1 - A \right] \quad (4)$$

The last relation (4) enables $R_2$ to be determined if the value of $R_3$ has been fixed. The value $R_1$ is then calculated by means of either of equations (2) and (3).

It is possible to modify the centre frequency $F_o$ by altering the values of resistors $R_1$ and $R_2$.

To design a modulator, it is possible, for example, to fix the values of voltage $kU$, capacitor $C$ and resistor $R_3$ and also the resistance ratios $m$ and $A$.

For example, in the case of a modulator used for transmission in accordance with Recommendation V.16 of the CCITT, "A modem for the transmission of analog medical data", three sub-carriers $F_o$ can be used (950 Hz, 1400 Hz and 2100 Hz) with a maximum frequency deviation $\Delta F_{max}$ of 100 Hz and a characteristic slope of 40 Hz/V can be used.

If the following values have been decided upon: $kU=9$ V, $C=2.2$ nF, $R_3=83$ kΩ, $m=0.5$, $A=0.37$ the following can be calculated for the central analog channel ($F_o=1400$ Hz): $R_2=28$ kΩ, $R_1=8.6$ kΩ.

Figure 5:
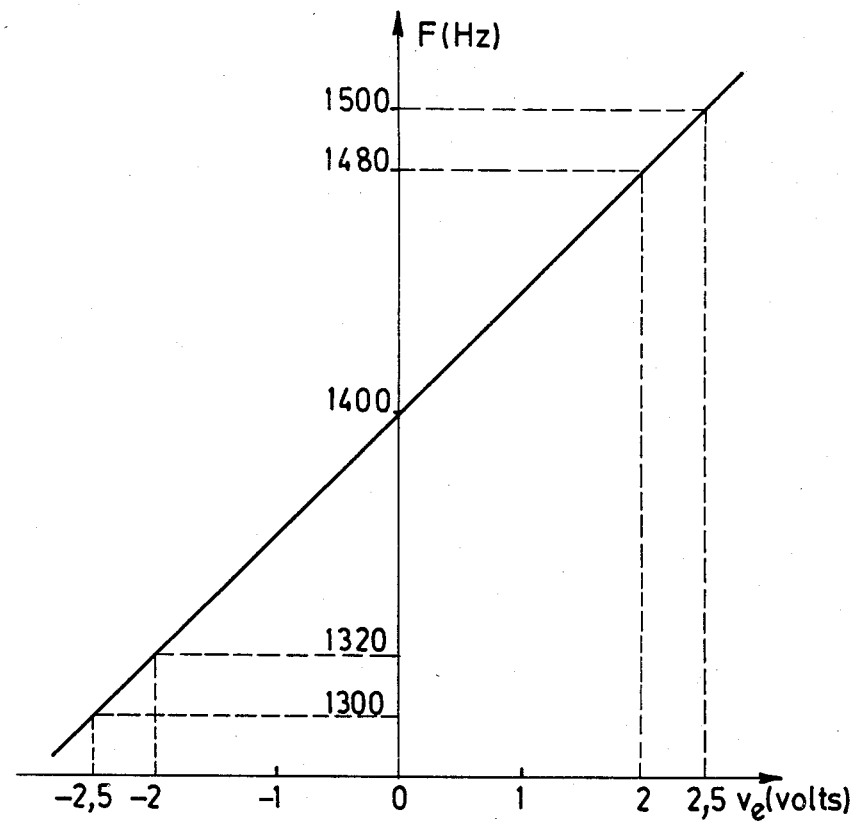
FIG. 5 shows the frequency-voltage characteristic of a modulator conforming to CCITT standards for the transmission of analog medical data.

FIG. 5 shows the characteristic $F(v_e)$ of this modulator.

It will be seen from this characteristic that a frequency deviation of 100 Hz corresponds to a variation in the data signal of between $-2.5$ V and $+2.5$ V.

The expressions for $v_{e1}$ and $v_{e2}$ arrived at above give:
when $v_e=+2.5$ V: $v_{e1}=5.24$ V and $v_{e2}=3.76$ V
when $v_e=-2.5$ V: $v_{e1}=7.08$ V and $v_{e2}=1.92$ V.

Recommendation V.16 of the CCITT allows for the possibility of using the centre analog channel to transmit digital data at a maximum speed of 100 Baud under the following conditions:
character 1 (break) for $F_1=1400$ Hz$-80$ Hz
character 0 (make) for $F_2=1400$ Hz$+80$ Hz The $\pm 80$ Hz frequency shift corresponds to $v_2=\pm 2$ V on the characteristic.

If the values of $v_{e1}$ and $v_{e2}$ are calculated with the parameter values shown above ($kU=9$ V, $A=0.37$), the following results are obtained:
when $v_e=+2$ V: $v_{e1}=5.42$ V and $v_{e2}=3.57$ V
when $v_e=-2$ V: $v_{e1}=6.90$ V and $v_{e2}=2.10$ V If, for example, a value $v_e=0$ V is applied instead of $v_e=2$ V to the input of circuit 17, A has to be recalculated by means of the expression for $v_{e1}$ in order to maintain the value $v_{e1}$ obtained with $v_e=2$ V, the other parameters remaining unchanged. With $v_{e1}=6.9$ V, $kU=9$ V and $v_e=0$, the value obtained for A is $A=0.53$ (the same result would have been obtained starting from $v_{e2}=2.10$ V).

With this new value for the parameter A, another value $v_e$ has to be applied which maintains the value $v_{e1}=5.42$ V calculated with $v_e=+2$ V. The calculation yields: $v_e=2.76$ V (the same result would have been retained starting from $v_{e2}=3.57$ V).

Figure 6:
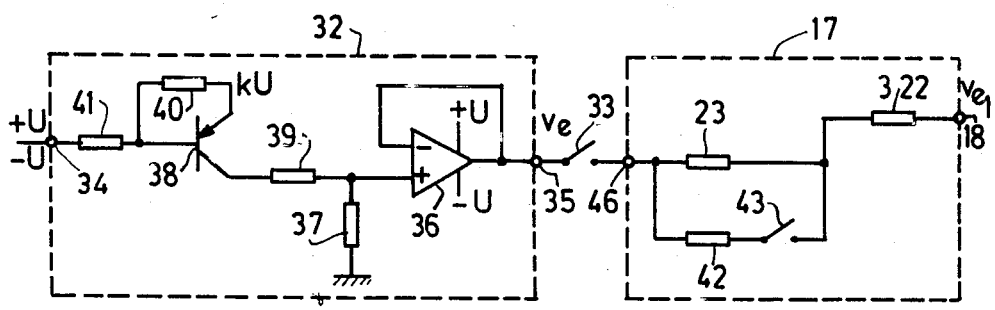
FIG. 6 shows a diagram of the digital data conversion circuit and the corresponding diagram modification in the analog data conversion circuit.

To fix this new value of parameter A it is sufficient to modify the ratio between the values of resistors 22 and 23 in circuit 17. The values of the voltage to be applied to input 16 of this circuit are then:
$v_e=0$ V to obtain $F_1=1400$ Hz$-80$ Hz
$v_e=2.76$ V to obtain $F_2=1400$ Hz$+80$ Hz These $v_e$ values are delivered at the output of a digital data conversion circuit 32 whose diagram is shown in FIG. 6 and transmitted through a switch 33 to input terminal 16 of the analog data conversion circuit. This circuit 32 is designed such that, from a digital data control signal applied to its input terminal 34 and whose potential values are $+U$ and $-U$, there is obtained at its output terminal 35 another control signal which is applied to input terminal 16 of circuit 17 so as to produce the said frequency shift. To that end it comprises an operational amplifier 36, which is fed by the sources of voltage $+U$ and $-U$ and whose output, connected to output terminal 35, is coupled back to its inverting input and whose non-inverting input is connected on the one hand to ground through a resistor 37 with a value $r_1$ and on the other hand to the collector of a type PNP transistor 38 through a resistor 38 with a value $r_2$. The base of this transistor is connected to its emitter, which is given a potential $kU$, through a resistor 40 and to input terminal 34 through a resistor 41. This terminal 34 receives the digital data control signal whose potential values are $+U$ and $-U$.

Also shown in FIG. 6 is the modification which must be made to circuit 17 to obtain the new value $A=0.53$. This modification consists in connecting in parallel to the terminals of resistor 23 a resistor 42 in series with a switch 43. The value of resistor 42 is 23.1 kΩ for values of resistors 22 and 23 which are respectively 3.7 kΩ and 10 kΩ.

For the transmission of digital data switches 33 and 43 are closed. The output of circuit 32 then provides the voltage $v_e$ and the ratio A changes from 0.37 to 0.53.

To determine the elements of circuit 32 so as to obtain the values of $v_e$ (2.76 V or 0 V) worked out above, the potential differences across resistors 37 and 39 have to be worked out.

When the potential $-U$ is applied to input 34 of the circuit, transistor 38 is in the conducting condition and a current i flows in resistors 37 and 39. The gain of operational amplifier 36 being assumed infinite, its output voltage $v_e$ fed back to its inverting input is also found at its non-inverting input. The potential difference across resistors 37 is therefore: $r_1 i = v_e$. Furthermore, if transistor 38 is saturated, the potential difference between the collector and emitter may be considered negligible so that the potential $kU$ is obtained at the collector. The potential difference across resistor 39 is then written: $r_2 i = kU - v_e$. The ratio of these two potential differences is equal to the ratio of resistors 37 and 39, the equation for which is:

$$\frac{r_2}{r_1} = \frac{kU}{v_e} - 1$$

To obtain the value $v_e=2.76$ V with $kU=9$ V, it is necessary to have $$\frac{r_2}{r_1} = 2.26.$$

If it is decided to have $r_1=10$ kΩ, then $r_2=22.6$ kΩ.

When the potential $+U$ is applied to the input terminal 26, transistor 38 is in the non-conducting condition. No current then flows through resistors 37 and 39. The situation therefore is: $r_1 i = v_e = 0$ V.

What is claimed is:

1. A modulator for transmitting an analog data signal by variation of the frequency of an oscillator comprising a first operational amplifier combined with a capacitor to form an integrator whose output is connected to the input of a bistable circuit with trigger hysteresis, the output of the bistable circuit supplying a two-level voltage which is applied to one terminal of a first resistor whose other terminal is connected to the input of said integrator so as to produce at its output a triangular wave voltage whose frequency depends on the current flowing through said first resistor, said bistable circuit being formed by a second operational amplifier followed by an inverter, one input of this operational amplifier being connected to the intermediate terminal of a resistor bridge connected between the outputs of said integrator and said bistable circuit, characterized in that said two-level voltage at the output of said bistable circuit is formed from zero ground potential and a fixed positive potential lower than the supply voltage U, applied respectively to the inputs of a first and a second analog switch whose common outputs are connected to the output of said bistable circuit, the input and output signals of said inverter being used respectively to control said first and second switches, said data signal being applied to the input of an analog data conversion circuit arranged so as to supply at its outputs a first and a second voltage which are variable as a function of the data signal and symmetrical with respect to the mean value of the third potentials at the inputs of said first and second switches, said first and second variable voltages being respectively applied to the inputs of a third and a fourth analog switch having their common outputs connected to one terminal of a second resistor whose other terminal is common with that of said first resistor, the input and output signals of said inverter being used respectively to control said third and fourth switches.

2. A modulator as claimed in claim 1, wherein said analog data conversion circuit is constituted by a third operational amplifier and a fourth operational amplifier each having an input receiving said mean value of the fixed voltages applied to the inputs of said first and second switches, the other input of the third operational amplifier being connected to its output through a third resistor and to the input of the said conversion circuit through a fourth resistor, the other input of the fourth operational amplifier being connected to its output through a fifth resistor and to the output of said third operational amplifier through a sixth resistor of the same value as the fifth resistor, the outputs of said third and fourth operational amplifiers being said outputs of the analog data conversion circuit.

3. A modulator as claimed in claim 1 wherein the modulator is also capable of transmitting a digital data signal with the aid of a given frequency shift by connecting to the input of said analog data conversion circuit the output from a digital data conversion circuit converting a control signal applied to its input and whose potential values are $+U$ and $-U$ into another control signal whose potential values are chosen such as to produce said frequency shift.

4. A modulator as claimed in claim 1 wherein all the circuits used are fed with a single supply voltage.